US008072242B2

(12) United States Patent
Barbier

(10) Patent No.: US 8,072,242 B2
(45) Date of Patent: Dec. 6, 2011

(54) MERGED PROGRAMMABLE OUTPUT DRIVER

(75) Inventor: Jean Barbier, Montpellier (FR)

(73) Assignee: Meta Systems, Meudon La Foret (FR)

( * ) Notice: Subject to any disclaimer, the term of this patent is extended or adjusted under 35 U.S.C. 154(b) by 0 days.

(21) Appl. No.: 12/642,647

(22) Filed: Dec. 18, 2009

(65) Prior Publication Data

US 2011/0148465 A1   Jun. 23, 2011

(51) Int. Cl.
 *H03K 19/094* (2006.01)
(52) U.S. Cl. .............................. 326/86; 326/87; 326/115
(58) Field of Classification Search .............. 326/82–83, 326/86–87, 115, 126, 127; 327/108–112
See application file for complete search history.

(56) References Cited

U.S. PATENT DOCUMENTS

| | | | |
|---|---|---|---|
| 5,958,026 A | 9/1999 | Goetting et al. | |
| 6,147,513 A * | 11/2000 | Bui | 326/83 |
| 6,239,612 B1 | 5/2001 | Shiflet | |
| 6,433,579 B1 | 8/2002 | Wang et al. | |
| 6,489,837 B2 | 12/2002 | Schultz et al. | |
| 6,653,873 B1 | 11/2003 | Nguyen | |
| 6,812,733 B1 | 11/2004 | Plasterer et al. | |
| 6,856,178 B1 * | 2/2005 | Narayan | 327/108 |
| 6,927,608 B1 | 8/2005 | Chen et al. | |
| 2006/0158223 A1 * | 7/2006 | Wang et al. | 326/86 |
| 2007/0176638 A1 * | 8/2007 | Park | 326/83 |
| 2009/0108872 A1 * | 4/2009 | Suenaga et al. | 326/82 |

* cited by examiner

*Primary Examiner* — Shawki S Ismail
*Assistant Examiner* — Jany Tran
(74) *Attorney, Agent, or Firm* — Dickstein Shapiro LLP

(57) ABSTRACT

Embodiments provide input/output devices having programmable logic that is programmable to operate input/output devices in one of two drive modes. In various embodiments, to operate an input/output device in a first drive mode, logic circuitry is programmable to couple a reference voltage to a gate of a transistor element of an output driver. In various embodiments, to operate an input/output device in a second drive mode, the logic circuitry is programmable to couple a bias voltage to the gate of the transistor element of the output driver. In various embodiments, the logic circuitry may also be programmable to couple one of a plurality of data inputs to the output driver to operate an input/output device in either a single-ended mode or a differential mode.

19 Claims, 8 Drawing Sheets

200

MERGED PROGRAMMABLE OUTPUT DRIVER

TECHNICAL FIELD

Embodiments relate to the field of integrated circuits. In particular to integrated circuits having programmable output drivers.

BACKGROUND

Conventional reprogrammable input/output (I/O) drivers can be programmed in single-ended voltage-drive mode, differential current mode, or differential voltage-drive mode. This is typically accomplished by providing two drivers, one for the differential mode, and another for the single-ended mode. One or the other is activated to produce the desired mode, while the other structure is disabled.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF EMBODIMENTS

Figure 1:
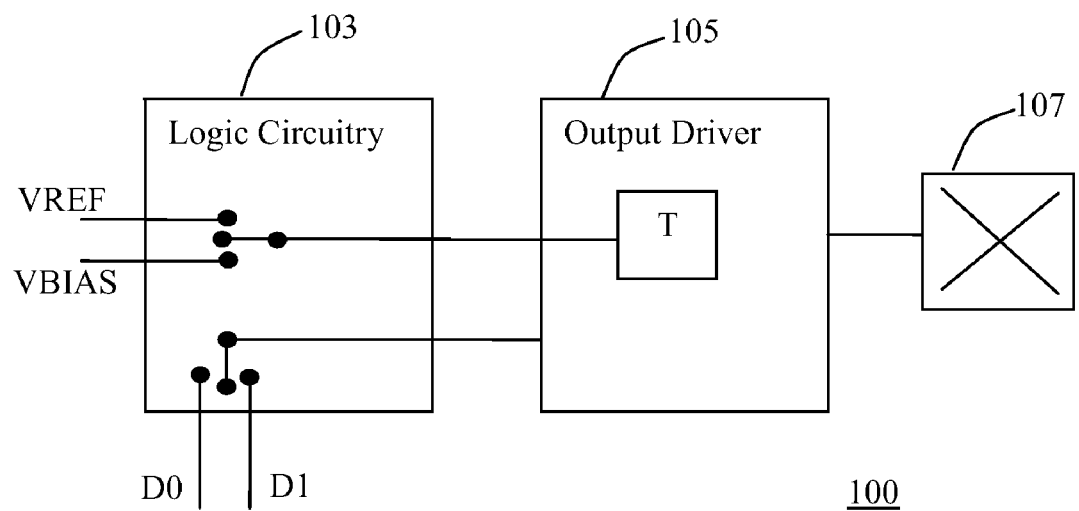
FIG. 1 illustrates a functional block diagram of an input/output (I/O) device having logic circuitry and an output driver, and that is programmable to operate in one of several drive modes in accordance with various embodiments.

In the following detailed description, reference is made to the accompanying drawings which form a part hereof, and in which are shown by way of illustration embodiments in which the invention may be practiced. It is to be understood that other embodiments may be utilized and that structural or logical changes may be made without departing from the scope of the disclosure. Therefore, this Detailed Description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The description may use the phrases "in an embodiment," or "in embodiments," which may each refer to one or more of the same or different embodiments. Furthermore, the terms "comprising," "including," "having," and the like, as used with respect to embodiments, are synonymous.

Various embodiments may provide an input/output (I/O) device that can be operated to function in two or more active operational modes, such as various current-drive modes or various voltage-drive modes. Reprogrammable logic circuitry of the I/O device may be programmable to apply a voltage to a gate of a transistor component of an output driver of the I/O device to operate the I/O device in one of two drive modes. To operate the I/O device in a current-drive mode, the reprogrammable logic circuitry may be programmable to couple a bias voltage, derived from a reference current, to the gate of a transistor component of the output driver. Deriving the bias voltage from a reference current may allow for configuration of desired current through the output driver when the I/O device is operating in current-drive mode. To operate the I/O device in a voltage-drive mode, the reprogrammable logic circuitry may be programmable to couple a predetermined reference voltage to the gate of the transistor component. In voltage-drive mode, the reference voltage may be selected to operate the transistor component in a fully ON mode. In embodiments, this may reduce or minimize the source-drain channel resistance of the transistor component.

In various embodiments, the reprogrammable logic circuitry may be programmable to operate the I/O device in a single-ended mode such as by selectively coupling the output driver to a particular data input for driving data to the output terminal of the output driver. The reprogrammable logic circuitry may also be programmable to operate the I/O device in a differential mode such as for example by selectively coupling the same or different data input to the output driver. In embodiments where the I/O device is programmable to operate in a differential mode, another output driver may be associated with the I/O device to drive the same selected data, or the inverse of the same selected data.

Use of the word "programmable" within this description may indicate that a device is programmable, reprogrammable, or otherwise capable of receiving signals, data, commands, programs, instructions, or the like, and that the device may act upon such signals, data, commands, programs, instructions, or the like to govern operation of the physical workings of the device. For example, I/O devices according to various embodiments of the present invention may be incorporated into field programmable gate arrays (FPGA). Output drivers and reprogrammable logic circuitry of such I/O devices may be programmable in the same or similar way as are interconnects and logic clusters within such FPGA devices.

The word "configured" may be used throughout this description to indicate that a thing or component is adapted to, or arranged to, do a certain thing, be a certain way, and/or perform a certain function, etc. "Configured" as used throughout this description is not meant to be a synonym for "programmed"; rather "programmed" may imply that a device has received an instruction, a program, a command, a data, a signal or the like to govern operation of the device in a certain way. "Configured" may mean "programmed" if the context that it is used in clearly indicates that such a meaning is implied, but it is not intended to have an equivalent meaning in all, or even most, contexts.

FIG. 1 illustrates a functional block diagram of an input/output (I/O) device 100 having logic circuitry 103 and an output driver 105, and that is programmable to operate in one of several drive modes in accordance with various embodiments. Output driver 105 may include various circuit components as will be described elsewhere within this description. In particular, output driver 105 may include transistor component T which may include one or more transistor components such as PMOS or NMOS type field effect transistors. Output driver 105 may be coupled to I/O pad 107 which may be configured to connect to external devices. In embodiments, I/O pad 107 may be coupled to an input driver (not shown).

Logic circuitry 103 may comprise programmable circuitry that may be programmable to couple one or more gate nodes of transistor component T to either reference voltage $V_{REF}$ or to bias voltage $V_{bias}$. In embodiments, bias voltage $V_{bias}$ may be derived from a reference current as will be described elsewhere within this Detailed Description. Output driver 105 may be configured such that coupling of a predetermined reference voltage $V_{REF}$ to one or more transistors of transistor component T may cause I/O device 100 to operate in a voltage drive mode. $V_{REF}$ may be selected such that a drain-to-source resistance in one or more transistors of transistor component T are minimized or reduced, thus operating the one or more transistors in a "fully ON" mode. As will be described in further detail below, output driver 105 may be configured to produce a predetermined output voltage on output pad 107 to operate I/O device 100 in voltage-drive mode.

Output driver 105 may be adapted or arranged such that coupling of bias voltage $V_{bias}$ to the one or more transistors of transistor component T may cause I/O device 100 to operate in a current-drive mode. The reference current may be selected such that these one or more transistors operate in an operational range that causes them to drive a desired current through I/O pad 107.

In embodiments, logic circuitry 103 and output driver 105 may not be completely or partially physically separate as is shown in FIG. 1. The block diagram of FIG. 1 is selected for clarity of understanding only. Some or all of logic circuitry 103 may be located near or adjacent to various components of output driver 105.

Logic circuitry 103 may be programmable to selectively couple one of several data inputs to output driver 105. To operate I/O device 100 in a single-ended drive mode, for example, logic circuitry 103 may be programmable to couple input data $D_1$ to output driver 105. To operate I/O device 100 in a differential drive mode, logic circuitry 103 may be programmable to couple input data $D_0$ to output driver 105. In embodiments, either or both inputs may be selected in either mode; in embodiments the same input may be used in both modes In embodiments, more than one reference voltage (such as $V_{REF}$) and/or more than one bias voltage (such as $V_{bias}$) may be provided to logic circuitry 103, and logic circuitry 103 may be programmable to couple each of the reference voltages and/or bias voltages to one or more components of output driver 105 (such as transistor component T) to operate I/O device 100 in either voltage-drive or current-drive mode.

Figure 2:
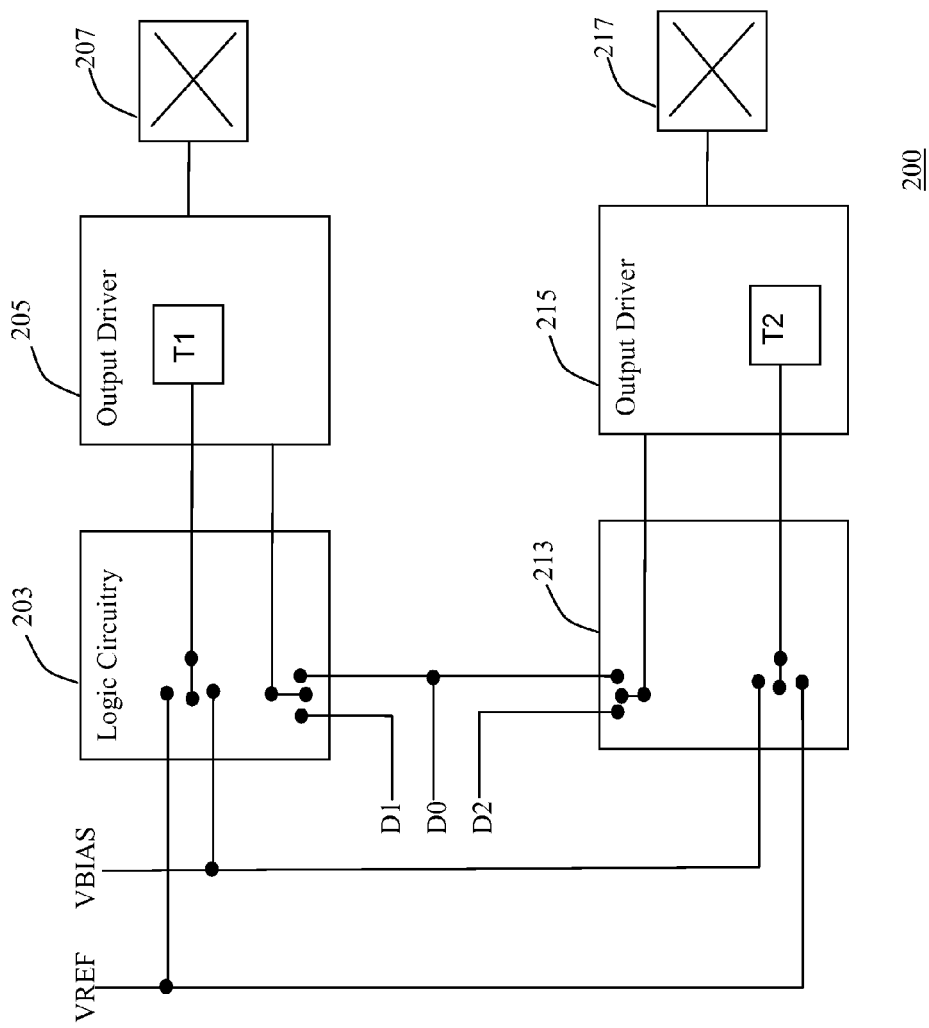
FIG. 2 illustrates a functional block diagram of a dual input/output (I/O) device that is programmable to operate in a single-ended drive more and in a differential drive mode in accordance with various embodiments.

FIG. 2 illustrates a functional block diagram of a dual input/output (I/O) device 200 that is programmable to operate at least in a single-ended drive mode and in a differential drive mode in accordance with various embodiments. Except as described below, logic circuitries 203 and 213, output drivers 205 and 215, transistor components T1 and T2, and I/O pads 207 and 217 may each be arranged in a same or similar way as are logic circuitry 103, output driver 105, transistor component T, and/or I/O pad 107 of FIG. 1, respectively.

Logic circuitry 213 may be programmable to selectively couple one of several data inputs into output driver 215. To operate I/O device 200 in a single-ended drive mode, for example, logic circuitry 213 may be programmable to couple input data $D_2$ to output driver 215. To operate I/O device 200 in a differential drive mode, logic circuitry 203 and/or logic circuitry 213 may be programmable to couple input data $D_0$ to output driver 205 and/or to output driver 215. In various embodiments, the inverse of data $D_0$ may be provided to one or more of logic circuitry 203, logic circuitry 213, output driver 205, and output driver 215 to operate I/O device 200 in differential drive mode. In various embodiments, output driver 213 and/or output driver 215 may be programmable to invert data $D_0$ to operate I/O device 200 in differential drive mode. In embodiments, either or both inputs may be selected in either single-ended or differential drive modes; in embodiments the same input may be used in both modes. In various embodiments, logic circuitries 203 and 213 may be separate within dual input/output device 200 or they may form a single logic circuitry. They are shown separate for sake of clarity.

A reference current $I_{REF}$ (not shown) may be provided to a current mirror (not shown) which may be configured to provide one or more bias voltages (such as $V_{bias}$) based on reference current $I_{REF}$. In various embodiments, $I_{REF}$ itself may be a programmable setting or may be provided by an external component in order to cause output driver 205 and/or output driver 215 to drive a predetermined current while I/O device 200 is programmed to operate in current-drive mode. The current mirror may be configured to provide one or more bias voltages based at least on $I_{REF}$. Various embodiments may include more than one current mirror, so that each may accept the same or different reference currents to produce the same or different bias currents.

Figure 3:
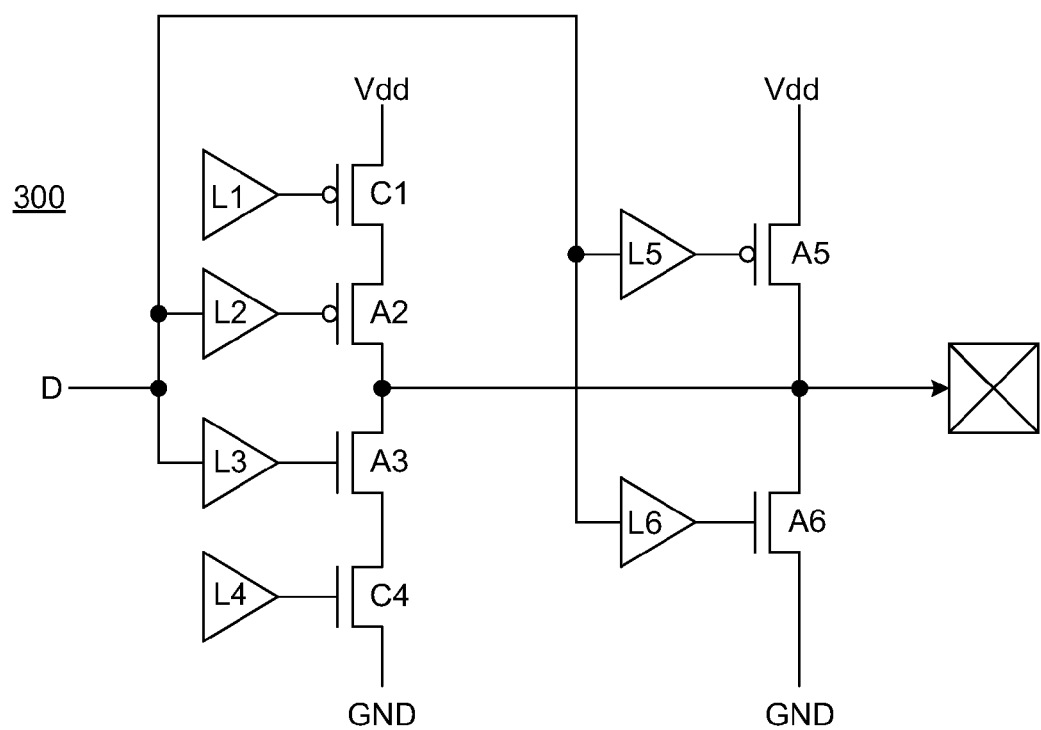
FIG. 3 illustrates a circuit diagram of an input/output (I/O) device programmable to operate in one of two drive modes in accordance with various embodiments.

FIG. 3 illustrates a circuit diagram of an input/output (I/O) device 300 programmable to operate in one of two drive modes in accordance with various embodiments. I/O device 300 may include six transistors (or six groups of parallel transistors as will be explained in more detail elsewhere within this Detailed Description) along with reconfigurable logic L1-L6 that are programmable to operate I/O device 300 according to the programmed drive modes. The physical arrangement of logic circuitry L1-L6 shown in FIG. 3 is for purposes of visual clarity. As will be understood, logic circuitry L1-L6 may be physically separated from the transistors of I/O device 300. Logic circuitry L2, L3, L5, and L6 may be programmable to couple transistors A2, A3, A5, and A6 to data input node D to achieve one drive mode or another. Once programmatically coupled to data input node D, transistors A2, A3, A5, and A6 may be enabled or disabled depending on the input voltage present on data input node D. In the example shown in FIG. 3, transistors A2 and A5 may be P-type MOS- FETS, and thus may be enabled by application of a low input voltage (such as for example a ground voltage which may or may not correspond to a binary "0"). By contrast, transistors A3 and A6 may be N-type MOSFETS, and thus may be enabled by application of a high input voltage (e.g. a supply or other voltage that may or may not correspond to a binary "1"). Transistors C1 and C4 may be operated in one of two ways by the logic circuitry in order to operate I/O device 300 in either voltage-drive mode or current-drive mode, as will be described more fully elsewhere within this Detailed Description.

Figure 4:
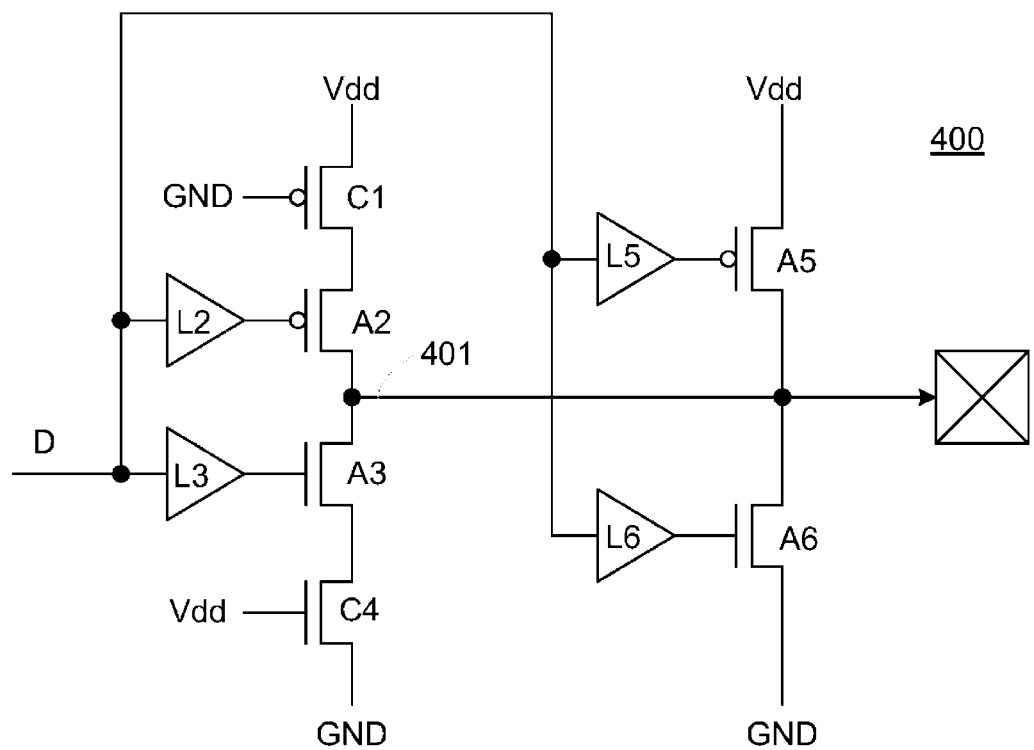
FIG. 4 illustrates a circuit diagram of an input/output (I/O) device programmed to operate in a voltage-drive mode in accordance with various embodiments.

FIG. 4 illustrates a circuit diagram of an input/output I/O device 400 programmed to operate in a voltage-drive mode in accordance with various embodiments. Logic circuitry as described elsewhere within this description may be programmable to couple transistors C1 and C4 to one or more reference voltages. In the example shown in FIG. 4, the logic circuitry may be programmable to couple a ground reference voltage (GND) to a gate of transistor C1 and to couple reference voltage $V_{dd}$ to a gate of transistor C4. Because transistor C1 is a P-type MOSFET, coupling a ground voltage to its gate may enable it and thus close a circuit between the supply voltage $V_{dd}$ and the node between transistor C1 and transistor A2. In alternative embodiments, a different reference voltage other than GND may be applied to the gate of transistor C1 to enable transistor C1. Likewise, because transistor C4 is an N-type MOSFET, coupling $V_{dd}$ to its gate may enable transistor C4, and close a circuit between GND and the node between transistor A3 and transistor C4. In alternative embodiments, a different reference voltage other than $V_{dd}$ may be applied to the gate of transistor C4 to enable transistor C4.

To operate I/O device 400 in voltage-drive mode, logic circuitry may be programmable to couple data node D to gates of each of A2, A3, A5, and A6. When the data value on data node D is a high voltage, transistors A2 and A5 may be disabled, opening a circuit between supply voltage $V_{dd}$ and output node 401. When the data value on data node D is a high voltage, transistors A3 and A6 may be enabled, closing a circuit between GND and output node 401. Thus, when the data value is high, data node 401 may be driven low (e.g., to ground), essentially inverting the high data value present on data node D.

Likewise, when the data value on data node D is low, transistors A2 and A5 may be enabled, closing a path between $V_{dd}$ and output node 401 and driving output node 401 to a high voltage. When the data value on data node D is a low voltage, transistors A3 and A6 may be disabled, which may isolate output node 401 from GND. Thus, when the data value is low, data node 401 may be driven high (e.g., to $V_{dd}$), essentially inverting the low data value present on data node D.

Figure 5:
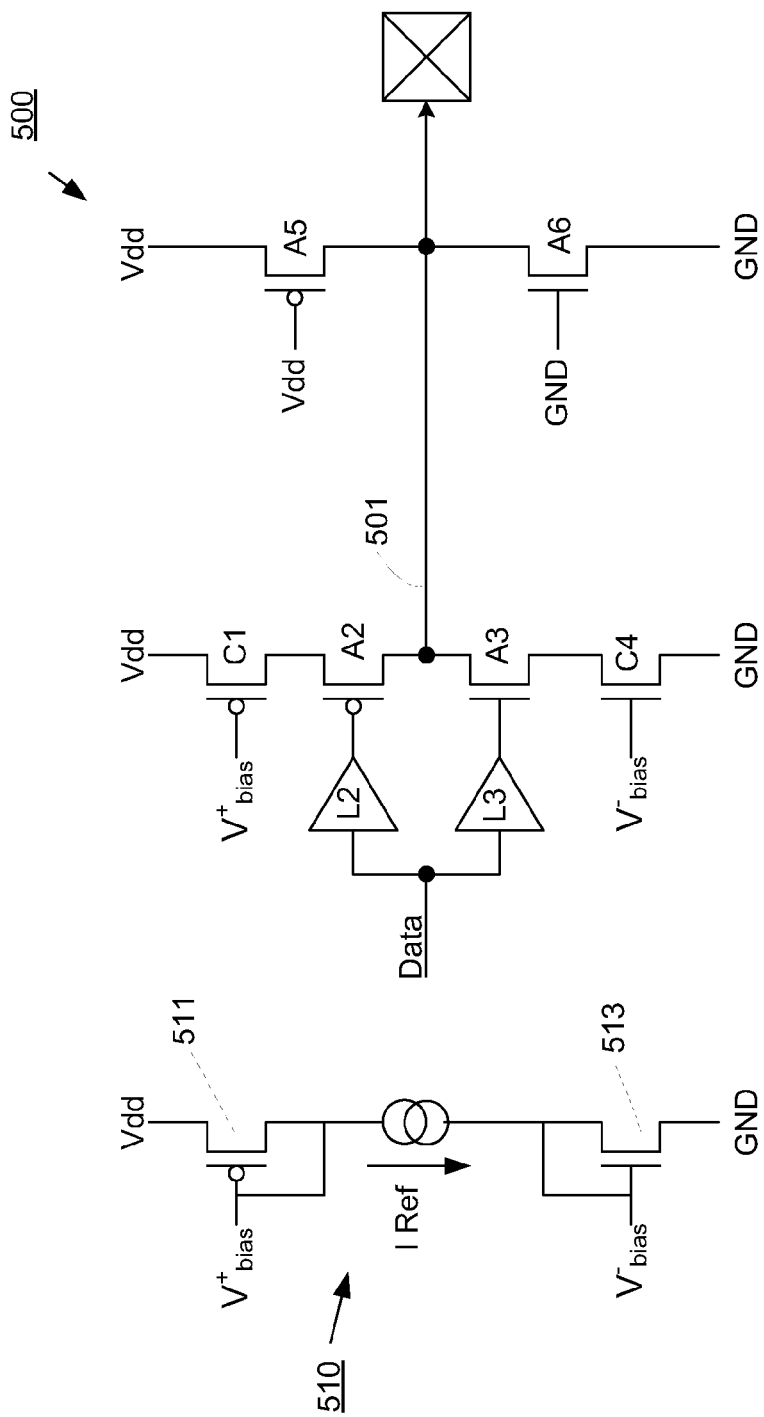
FIG. 5 illustrates a circuit diagram of an input/output (I/O) device programmed to operate in a current-drive mode in accordance with various embodiments.

FIG. 5 illustrates a circuit diagram of an input/output (I/O) device 500 programmed to operate in a current-drive mode in accordance with various embodiments. To operate I/O device 500 in current-dive mode, logic circuitry may be programmable to disable transistors A5 and A6. Logic circuitry may be programmable to couple bias voltages $V^+_{bias}$ and $V^-_{bias}$—each derived from a reference current $I_{REF}$—to gates of transistors C1 and C4. Doing so may cause a pre-determined amount of current to flow through transistor C1 or transistor C4 into output node 501, as determined by which of transistors A2 and A3 are enabled by the data value on data node D. When the data value is high, transistor A2 may be disabled and transistor A3 may be enabled, causing a predetermined current to flow from output node 501 to ground; when the data value is low, transistor A3 may be disabled, and transistor A2 may be enabled, causing the predetermined current to flow from $V_{dd}$ to output node 501. In this way, data values applied to input data node D may result in current through output node 501.

Current mirror 510 may be configured to derive the bias voltages from reference current $I_{REF}$ provided by an external source. Reference current $I_{Ref}$ may cause gates of transistors 511 and 513 to obtain bias voltages $V^+_{bias}$ and $V^-_{bias}$, respectively. It will be understood that current mirror 510 may be selectively coupled to output driver 500 via logic circuitry (not shown) as described elsewhere within this Detailed Description.

Figure 6:
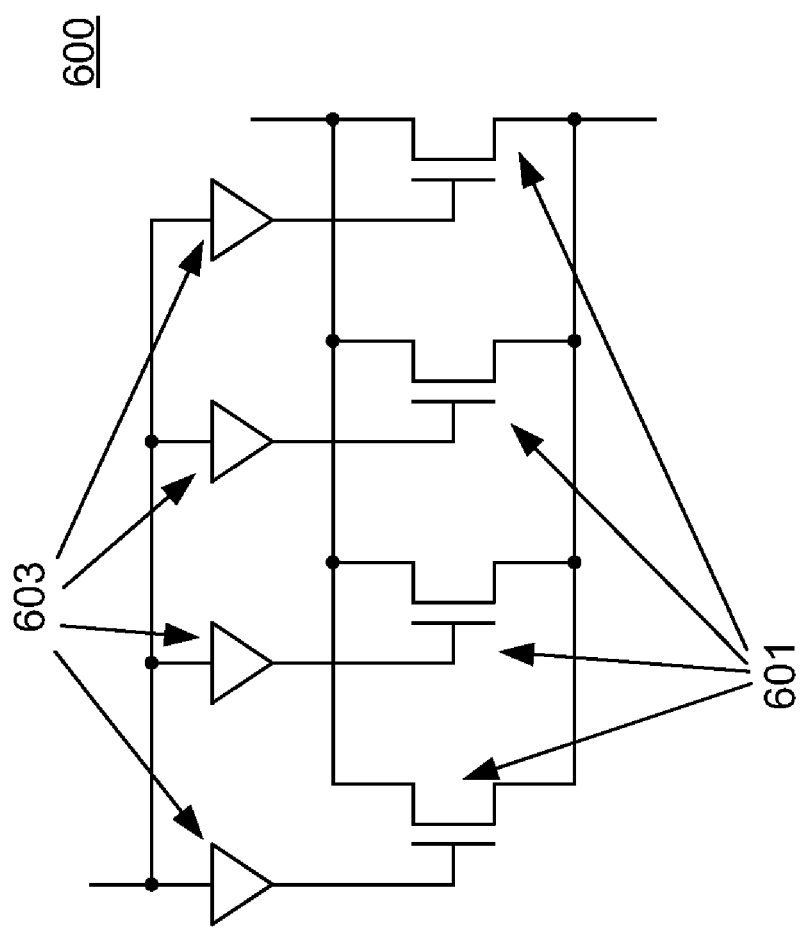
FIG. 6 illustrates a parallel transistor structure of an input/output (I/O) device according to several embodiments.

FIG. 6 illustrates a parallel transistor structure 600 of an input/output (I/O) device according to various embodiments. Referring back to FIGS. 1 and 2, for example, transistor components T (in FIG. 1), T1 (in FIG. 2), and/or T2 (in FIG. 2) may comprise a single transistor or it may comprise a parallel transistor structure such as the one shown in FIG. 6. Referring back to FIG. 3, for example, any of transistors C1, A2, A3, C4, A5, or A6 in FIG. 3 may be a parallel transistor structure such as the one shown in FIG. 6. There may be, in just one exemplary embodiment, four C1 transistors, three A2 transistors, and five A6 transistors. It will be understood that all or none of transistors C1, A2, A3, C4, A5, and A6 may be a parallel transistor structure. It will be understood that parallel transistor structures according to various embodiments may have fewer or more transistors than are shown in FIG. 6.

Logic circuitry 603 may be programmable to independently couple each transistor 601 of parallel transistor structure 600 to reference voltages, bias voltages, or to data inputs as appropriate to operate the I/O device in the desired drive mode, as described elsewhere within this Detailed Description. Also, logic circuitry 603 may be programmable to independently enable all or fewer than all of the transistors 601 in parallel transistor structure 600 in order to alter drive strength of the I/O device. In various embodiments, some of transistors 601 may be larger than others. In various embodiments, higher drive strength may be achieved by enabling larger transistors, a larger number of transistors, or some combination thereof. Even though logic circuitry 603 is shown in FIG. 6 as being coupled to a common node, different reference voltages, bias currents, or data inputs may be applied to different ones of transistors 601 according to various embodiments. Such different bias currents, for example, may be derived from the same or different reference currents by the same or different current mirrors.

Figure 7:
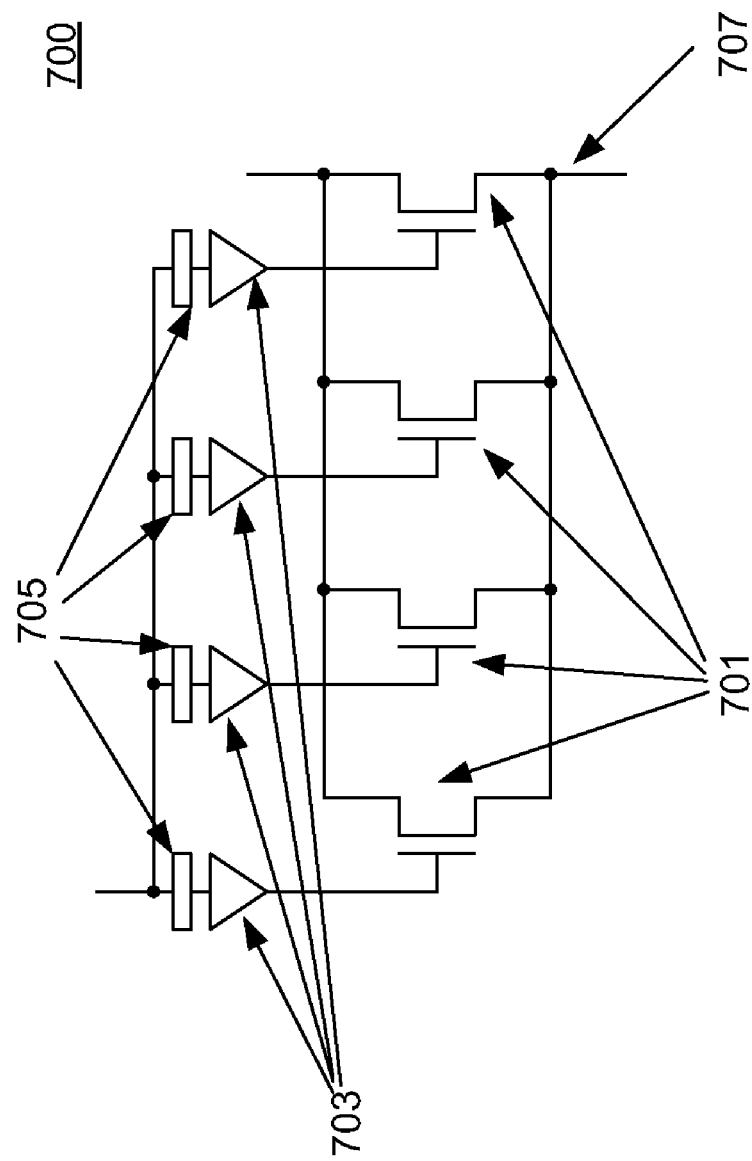
FIG. 7 illustrates a parallel transistor structure having delay elements to alter the skew rate of data transitions according to several embodiments.

FIG. 7 illustrates a parallel transistor structure 700 having delay elements 705 to alter the slew rate of data transitions on output node 707 according to several embodiments. In various embodiments, logic circuitry 703 may be programmable to independently delay the operation of each transistor 701 in parallel transistor structure 700. Each transistor's operation may be delayed by a different amount by its corresponding delay element 705. Thus, the drive strength of the output driver may be increased incrementally in order to reduce the rate of change of an output signal while retaining the required drive strength. This may allow the slew rate of the signal to be controlled, thereby reducing noise associated with fast slew rates.

Alternatively, logic circuitry may be programmable to operate two or more transistors—such as the transistors in transistor structure 600 or 700—immediately upon a change in data values, but then cut off one or more of the transistors after a short period of time, as determined by the corresponding delay element 705. This may cause increased drive strength when the signal initially changes, but the drive strength may then taper off as transistors are disabled. This mode of operation may allow a pre-emphasis effect to be implemented in a programmable way. In still other embodiments, logic circuitry 705 may be programmable to sequentially turn on a first group of one or more of transistors 701 at a first point in time, then turn on a second group one or more of transistors 701 at a second point in time (later than the first point in time). In such embodiments, the logic circuitry may be programmable to then turn off the first group of the one or more of transistors 701 at a third point in time (later than both the first and the second points in time). Logic circuitry 705 according to embodiments may be programmable to turn on any combination of transistors 701 in any order, and for any of various time periods, to achieve a desired slew rate or other result.

Figure 8:
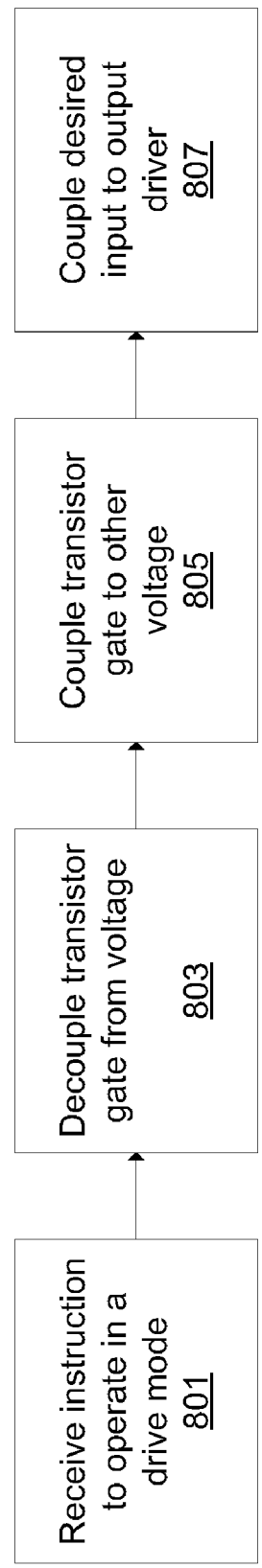
FIG. 8 illustrates a method of operating an input/output (I/O) device according to several embodiments.

FIG. 8 illustrates a method of operating an input/output I/O device according to several embodiments. Programmable logic circuitry of the I/O device may receive an instruction to operate an I/O device in a particular drive mode, block 801. The programmable logic circuitry may decouple a gate of a transistor from a voltage, block 803. The programmable logic may then couple the transistor gate to a new voltage—such as a predetermined reference voltage or a bias voltage derived from a reference current—block 805. The programmable logic may couple a desired input to an output driver of the I/O device, according to the desired drive mode, block 807. For example, a first input may be coupled to the output driver to operate the I/O device in a differential mode, while a different output may be coupled to the output driver to operate the I/O device in single-ended mode. These operations need not occur in any particular order. For example, in embodiments, the coupling and decoupling may occur in parallel or the coupling may occur before the decoupling.

In various embodiments, I/O devices of the present invention may be included within an integrated circuit such as, for example, a FPGA device. Integrated circuits according to embodiments may be utilized in personal computers, personal data assistants, specialized computing systems, communication devices such as routers, switches, and gateways. Embodiments may be employed in cellular telephones, handheld devices such as handheld media players, industrial devices such as test circuits, command and control systems, as well as other devices. Embodiments of the present invention are not limited to use in any type or sets of types of devices and systems. Embodiments may also be utilized within emulation devices, to emulate an Application-specific integrated circuit (ASIC) design.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the disclosure. Those with skill in the art will readily appreciate that embodiments of the disclosure may be implemented in a very wide variety of ways. This application is intended to cover any adaptations or variations of the embodiments discussed herein. Therefore, it is manifestly intended that embodiments of the disclosure be limited only by the claims and the equivalents thereof.

What is claimed is:

1. An apparatus; comprising:
an output driver comprising:
an output node,
a first PMOS transistor having a source node coupled to a supply voltage,
a second PMOS transistor having a source node coupled to a drain node of the first PMOS transistor and a drain node coupled to the output node, and
a third PMOS transistor having a source node coupled to the supply voltage and a drain node coupled to the output node, and
logic circuitry coupled to the output driver, the logic circuitry including one or more circuit elements arranged to enable the logic circuitry to be programmable to apply either:
a predetermined reference voltage to a gate of the first PMOS transistor to operate the apparatus in a voltage-drive mode, or
a bias voltage to the gate of the first PMOS transistor to operate the apparatus in a current-drive mode, wherein:
the output driver is a first output driver;
the apparatus further comprises a second output driver comprising a fourth PMOS transistor having a source node coupled to the supply voltage;
the logic circuitry is coupled to the second output driver;
the logic circuitry is further programmable to selectively apply the predetermined reference voltage to a gate of the fourth PMOS transistor to operate the apparatus in the voltage-drive mode; and
the logic circuit is further programmable to selectively apply the bias voltage to the gate of the fourth PMOS transistor to operate the apparatus in the current-drive mode.

2. The apparatus of claim 1, further comprising a current mirror coupled to the logic circuitry and configured to receive a reference current and to produce the bias voltage for the logic circuit, based at least in part on the reference current.

3. The apparatus of claim 1, wherein the reference voltage is referenced to either the supply voltage or to a ground voltage.

4. The apparatus of claim 1, wherein the reference voltage comprises either the supply voltage or a ground voltage.

5. The apparatus of claim 1, wherein the output driver further comprises:
a first NMOS transistor having a drain node coupled to the output node; and
a second NMOS transistor having a drain node coupled to a source node of the first NMOS transistor, and a source node coupled to a ground node.

6. The apparatus of claim 5, wherein the reference voltage is a first reference voltage, the bias voltage is a first bias voltage, and the logic circuitry is coupled to a gate of the second NMOS transistor and further programmable to selectively apply a second predetermined reference voltage to the gate of the second NMOS transistor to operate the apparatus in the voltage-drive mode, and wherein the logic circuitry is further programmable to selectively apply a second bias voltage to the gate of the second NMOS transistor to operate the apparatus in the current-drive mode.

7. The apparatus of claim 6, wherein the gate of the second PMOS transistor and the gate of the first NMOS transistor are coupled to a data input node of the apparatus.

8. The apparatus of claim 6, further comprising:
a third NMOS transistor having a drain node coupled to the output node and a source node coupled to the ground node;
wherein the logic circuitry is further programmable to selectively couple the input node to a gate of the third PMOS transistor and to selectively couple the input node to a gate of the third NMOS transistor to operate the apparatus in the voltage-drive mode; and wherein the logic circuitry is further programmable to selectively apply a first disabling voltage to the gate of the third PMOS transistor and to selectively apply a second disabling voltage to the gate of the third NMOS transistor to operate the apparatus in the current-drive mode.

9. The apparatus of claim 1, further comprising a data input node coupled to the logic circuitry, wherein the logic circuitry is further programmable to couple an input data value received on the data input node to the first output driver and to couple an inverted version of the input data value to the second output driver to operate the apparatus in a differential mode.

10. The apparatus of claim 1, further comprising a data input node coupled to the logic circuitry, wherein the logic circuitry is further programmable to couple an input data value received on the data input node to the first output driver and to the second output driver, and wherein the second output driver is programmable, or configured, to invert the input data value to operate the apparatus in a differential mode.

11. The apparatus of claim 1, further comprising a first data input node coupled to the logic circuitry and a second data input node coupled to the logic circuitry.

12. The apparatus of claim 1, wherein the first PMOS transistor is one of a plurality of PMOS transistors arranged in parallel, the logic circuitry is further programmable to selectively apply either the predetermined reference voltage or other reference voltages to gates of one or more of the plurality of PMOS transistors to control a drive strength in the voltage-drive mode, and the logic circuitry is further programmable to selectively apply either the bias voltage or other bias voltages to the gates of one or more of the plurality of PMOS transistors to control a drive strength in the current-drive mode.

13. The apparatus of claim 1, wherein the apparatus is an input/output driver of an integrated circuit.

14. The apparatus of claim 1, wherein the apparatus is an input/output driver of a field programmable gate array.

15. A method, comprising:
receiving, by a logic circuitry of an input/output device, an instruction to operate the input/output device in a drive mode, wherein the input/output device includes an output driver having a first PMOS transistor coupled to a supply voltage and second and third PMOS transistors coupled to an output node;
coupling, by the logic circuitry in response to receiving the instruction, a voltage to a gate of the first PMOS transistor to operate the integrated circuit in the drive mode, wherein the voltage is a selected one of a reference voltage, or a bias voltage;
receiving, by the logic circuitry, another instruction to operate the input/output device in either a single-ended drive mode or a differential drive mode; and
selectively coupling one of two data inputs to the output driver, based at least on the other instruction.

16. The method of claim 15, wherein the instruction is a first instruction, the voltage is a first voltage, and the drive mode is a first drive mode, and wherein the method further comprises:
receiving, by the logic circuitry, a second instruction to operate the input/output device in a second drive mode; and
coupling, by the logic circuitry in response to receiving the second instruction, a second voltage to the gate of the first PMOS transistor to operate the input/output device in the second drive mode.

17. The method of claim 16, further comprising decoupling, by the logic circuitry, the first voltage from the gate of the first PMOS transistor in response to receiving the second instruction.

18. The method of claim 15, wherein the drive mode is a selected one of a voltage drive mode and a current drive mode.

19. The method of claim 15, further comprising receiving, by a current mirror of the integrated circuit, a reference current, and providing, by the current mirror, the bias voltage to the logic circuitry.

* * * * *